(12) United States Patent
Charlet et al.

(10) Patent No.: US 9,143,154 B2
(45) Date of Patent: Sep. 22, 2015

(54) METHOD AND DEVICE FOR CONVERTING A DIGITAL SIGNAL INTO OPTICAL PULSES

(75) Inventors: Gabriel Charlet, Nozay (FR); Jeremie Renaudier, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/877,587

(22) PCT Filed: Oct. 17, 2011

(86) PCT No.: PCT/EP2011/068086
§ 371 (c)(1),
(2), (4) Date: Apr. 15, 2013

(87) PCT Pub. No.: WO2012/059312
PCT Pub. Date: May 10, 2012

(65) Prior Publication Data
US 2013/0214949 A1    Aug. 22, 2013

(30) Foreign Application Priority Data
Nov. 4, 2010   (FR) .................................... 10 04335

(51) Int. Cl.
H04B 10/04    (2006.01)
H03M 1/66    (2006.01)
H03M 5/16    (2006.01)
H04B 10/556    (2013.01)
H04B 10/00    (2013.01)

(52) U.S. Cl.
CPC    *H03M 1/66* (2013.01); *H03M 5/16* (2013.01); *H04B 10/5561* (2013.01)

(58) Field of Classification Search
CPC . H04B 10/548; H04B 10/556; H04B 10/5561
USPC ......................................................... 398/188
See application file for complete search history.

(56) References Cited

U.S. PATENT DOCUMENTS

2003/0035496 A1    2/2003    Noda
2006/0291868 A1*   12/2006   Yee et al. ..................... 398/152
(Continued)

FOREIGN PATENT DOCUMENTS

EP      2058690         5/2009
JP      2003060721      2/2003
WO   WO 2010100763 A1 *  9/2010

OTHER PUBLICATIONS

K. Suzuki et al; Reduction of Backscattering-Induced Noiseby Ternary Phase Shift Keying in Resonarmicro-optic Gyro Integrated on Silica Planar Lightwave Circuit; Electronic Letters; 1999; XP002679572; Retrieved from the Internet: URL:http://ieeexplore.ieee.org/stamp/stamp.jsp?tp=&arnumber=784538; [retrieved Jul. 10, 2012].
(Continued)

*Primary Examiner* — Daniel Dobson
(74) *Attorney, Agent, or Firm* — Patti & Malvone Law Group, LLC (57) ABSTRACT

To that end, it is an object of the invention to provide a method for converting a high-speed digital signal in the form of optical pulses intended to be transmitted within optical guides, within which the signal is converted into a series of optical pulses in three possible phase states ($\pi/6$, $5\pi/6$, $-\pi/2$) separated from one another two-by-two by an angle greater than $\pi/2$.

15 Claims, 6 Drawing Sheets

(56) References Cited

U.S. PATENT DOCUMENTS

2009/0324247 A1* 12/2009 Kikuchi ..................... 398/159
2011/0305457 A1* 12/2011 Kikuchi ..................... 398/65

OTHER PUBLICATIONS

M. Rowe; Complex Modulation Comes to Optical Fiber; Test & Measurement World; Mar. 28, 2010; XP002644758; Retrieved from the Internet: URL:http://www.tmworld.com/article;450458-Complex_modulation_comes_to_optical_fiber.php; [retrieved on Jun. 24, 2011].

M. Nakamura et al; Ternary Phase Shift Keying and Its Performance; Wireless Personal Multimedia Communications; 2002; The 5th International Symposium on, 2002; XP002679573; Retrieved from the Internet: URL: http://ieeexplore.ieee.org/stamp/stamp.jsp?tp=&arnumber=1088386&tag=1; [retrieved on Jul. 10, 2012].

Anonymous; Trends and Issues in Ultra-High Speed Transmission Technologies (MP1800A Signal Quality Analyzer; Anritsu; Mar. 27, 2009; XP002644767; Retrieved from the Internet: URL:http://www.anritsu.com/en-gb/downloads/technical-notes/technical-note/dw13560.aspx; [retrieved on Jun. 23, 2011].

* cited by examiner

| 000 | $\pi/6$ | $\pi/6$ |
| 001 | $\pi/6$ | $5\pi/6$ |
| 010 | $\pi/6$ | $-\pi/2$ |
| 011 | $5\pi/6$ | $\pi/6$ |
| 100 | $5\pi/6$ | $5\pi/6$ |
| 101 | $5\pi/6$ | $-\pi/2$ |
| 110 | $-\pi/2$ | $\pi/6$ |
| 111 | $-\pi/2$ | $5\pi/6$ |
| XXX | $-\pi/2$ | $-\pi/2$ |

METHOD AND DEVICE FOR CONVERTING A DIGITAL SIGNAL INTO OPTICAL PULSES

FIELD OF THE INVENTION

The invention relates to a method for converting and transmitting a digital signal into optical pulses in order to transmit data at high speeds by an optical guide, particularly by optical fibers.

BACKGOUND

In the field of telecommunications, digital data, stored and sent in the form of bits, are converted into pulses of light, which are then sent by optical guides, such as optical fibers. These guides or optical fibers are particularly used whenever a signal must be transmitted over great distances, such as between continents.

In order to enable a very high flow of data, in particular on the order of 100 Gbit/s, it is known to use the phase of the optical signal for modulation, in order to convert a large quantity of information through pulses. This method, known by the name of phase modulation conversion, or "Phase-Shift Keying" PSK, uses optical pulses with multiple phase states in order to code the transmitted optical signal.

The phase states, which are finite in number, vary between 0 and $2\pi$ and are conventionally represented by a mark on a unit circle. This representation is known as a constellation diagram. Constellation diagrams as already used are particularly depicted in FIGS. 1 and 2.

Figure 1:
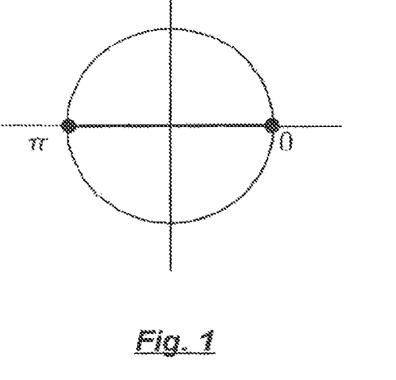
FIG. 1 is a constellation diagram corresponding to the binary phase-shift.

FIG. 1 depicts the constellation diagram of the binary phase modulation. The phase states of binary phase-shift keying, BPSK, are oriented along two ($2^1$) directions, separated by about $\pi$. In this case, one of the directions codes a 0 bit, and the other one a 1 bit. A pulse corresponds to one bit.

Figure 2:
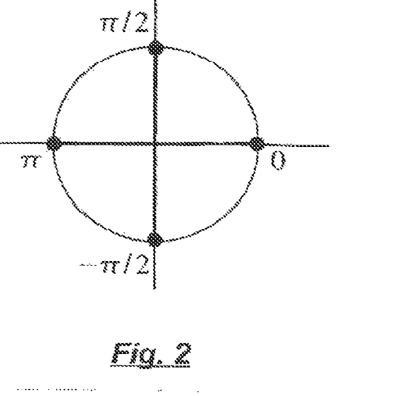
FIG. 2 is a constellation diagram corresponding to the quaternary phase-shift.

FIG. 2 detects the constellation diagram of the constellation diagram of quaternary phase-shift keying In the event of quaternary phase-shift keying, four ($2^2$) different phase states are used, separated by about $\pi/2$. A pulse corresponds to two bits, with the four states corresponding to the four values 00, 01, 10, 11.

Thus, it is understood that given the same quantity of pulses sent per unit of time, i.e. at the same symbol rate, conversion to quaternary coding enables a bitrate measured for a given unit of time (bit/s) that is twice the bitrate enabled by binary coding.

However, in the context of long-distance communications, particularly when the pulses travel hundreds, or even thousands, of kilometers within the optical guide, effects of dispersion, spreading, and more generally, nonlinearity do appear.

In order to prevent them from harming the quality of the signal on the receiving end, it is necessary either to carry out an optical-electronic signal regeneration at regular intervals, which costs resources and is sometimes impossible for the hardware, or else to increase the separation between the phase states of the constellation diagram.

Conversion to quaternary coding is, due to the lesser angular distance between the phase states of its constellation, more sensitive to nonlinear disruptions.

Conversion to binary coding is less sensitive to nonlinear disruptions, but allows only a lesser bitrate at a given symbol rate.

Thus, there is a need for an encoding that combines images of both of the previously described methods, in order to enable higher-speed communication over longer distances.

SUMMARY

To that end, it is an object of the invention to provide a method for converting a high-speed digital signal in the form of optical pulses intended to be transmitted within optical guides, within which the signal is converted into a series of optical pulses in three possible phase states ($\pi/6$, $5\pi/6$, $-\pi/2$) separated from one another two-by-two by an angle greater than $\pi/2$.

In this manner, we obtain an encoding that has both less sensitivity to disruptions over long distances than quadrature phase shift keying, while enabling a greater bitrate than binary phase shift keying.

Furthermore, the method may comprise one or more of the characteristics, taken alone or in combination, from among the ones that follow.

The phase states ($\pi/6$, $5\pi/6$, $-\pi/2$) are separated from one another two-by-two by an angle of about $2\pi/3$.

The digital signal has a bitrate of about 40 Gigabit/s or 100 Gigabit/s.

The signal is distributed into subsets comprising three bits, and in which two optical pulses serve to code the value of the subsets.

The step of converting the subsets comprises the following steps:
    separating an optical signal into three intermediary beams, phase-shifting the three intermediary beams away from one another by an angle of about $2\pi/3$,
    selecting one of the intermediary beams to create optical pulses coding the value of the subsets.

The step of converting the subsets comprises the following steps:
    separating an optical signal into three intermediary beams comprising an intermediary baseline beam and two secondary intermediary beams whose amplitude is about $\sqrt{3}$ times greater than the intermediary baseline beam.
    phase-shifting the secondary intermediary beams by about $+5\pi/6$ and $-5\pi/6$ from the intermediary baseline beam,
    selecting and combining one or none of the secondary intermediary beams with the intermediary baseline beam in order to create optical pulses coding the value of the subsets.

The step of converting the subsets comprises the following steps:
    separating a primary optical signal into two intermediary beams, phase-shifting the intermediary beams by about $\pi/3$ from one another,
    positioning the emission zero at about ⅓ of the maximum amplitude in order to define, for the intermediary beams, a high state and a low state,
    combining the intermediary beams in their high or low states in order to create optical pulse coding the value of the subsets.

The intermediary beams are directed towards Mach-Zehnder interferometers having their zero operating point at about 0.33 times the half-wave voltage of a minimum transmitted power, and high and low operating voltages, respectively associated with the high and low states, located respectively at about +0.66 times the half-wave voltage and about −0.66 times the half-wave voltage of the zero operating point.

It is also an object of the invention to provide the devices associated with said method, which have one or more of the following characteristics, taken alone or in combination.

The device comprises means of separating an optical signal into three intermediary beams comprising an intermediary baseline beam and two secondary intermediary beams whose amplitude is about $\sqrt{3}$ times greater than the baseline beam, and different optical paths for intermediary beams causing a phase-shifting of the two secondary intermediary beams by +5π/6 and −5π/6 respectively from the baseline beam, as well as a controller and switches controlled by the controller that can selectively interrupt one of the secondary intermediary beams The device comprises means of separating an optical signal into three intermediary beams, and different optical paths for intermediary beams causing a phase shift of about π/3 between them, interferometers having their zero operating point at about 0.33 times the half-wave voltage of a minimum transmitted power, and high and low operating voltages, respectively associated with the high and low states, located respectively at about +0.66 times the half-wave voltage and about −0.66 times the half-wave voltage of the zero operating point placed on the optical paths of the intermediary beams and a controller controlling the Mach-Zehnder interferometers.

The device comprises a device to transcribe coded signals intended for quaternary modulation conversion into coded signals intended for ternary modulation conversion, linked to the controller.

The switches comprise electro-absorption modulator switches (EAMs).

The device to convert and emit a high-speed digital signal in the form of optical pulses comprises a digital-analog converter intended to convert the high-speed digital signal into a three-state analog signal, and a three-phase-state phase modulator linked to the digital-analog converter and controlled by the three-state analog signal emitted by said digital-analog converter, from whose output the optical pulses are emitted.

The device to convert and emit a high-speed digital signal in the form of optical pulses comprises two digital-analog converter intended to convert the high-speed digital signal into two analog signals, one with three states, the other with two states, and a quaternary phase modulator comprising two arms, corresponding to two optical paths phase-shifted by about π/2, and respectively piloted by one of the analog signals, from whose output the optical pulses are emitted.

BRIEF DESCRIPTION OF DRAWINGS

Other characteristics shall become apparent upon reading the description of the following figures, among which.

DETAILED DESCRIPTION

Figure 3:
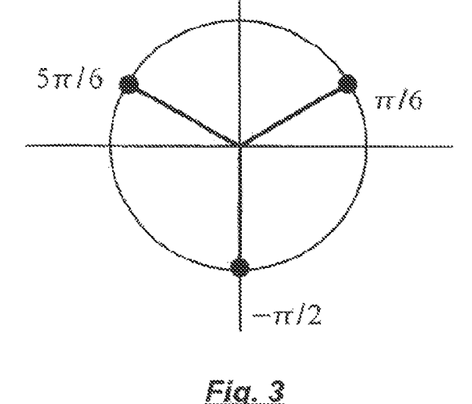
FIG. 3 is a constellation diagram corresponding to the ternary phase-shift.

It is an object of the invention to provide a method for converting and emitting a high-speed digital signal, representing, for example, a data flow, typically on the order of 100 Gigabit/s, in the form of optical pulses for communication by optical guides, particularly by optical fibers. The encoding of the signal is done by conversion into optical pulses having three predetermined phase states FIG. 3 depicts a three-phase state constellation diagram, spaced 2π/3 apart.

Figure 4:
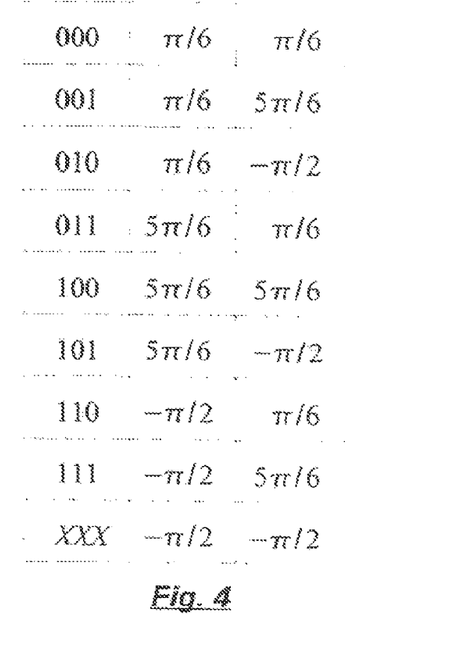
FIG. 4 is an example table to convert a digital signal into pairs of ternary phase-shift pulses.

FIG. 4 depicts how the signal is encoded. The incoming signal is converted into subsets of three bits, which gives subsets that have eight ($2^3$) possible values, ranging from 0 to 7 in binary base. These values are represented in the first column of the table in FIG. 4.

These subsets are therefore packets with a whole number of bits, three, matched with a whole number of optical pulses, two.

The row of the table in FIG. 4 gives, in order: the value of the three-bit subset, the phase state of a first pulse, the phase estate of a second pulse, with the two pulses coding, by their phase state, the subset's value.

One subset is associated with two optical pulses. The phase states, chosen from among three possible states π/6, 5π/6 or −π/2 of the ternary coding of the two pulses, are shown in the last two columns of the table. Among the nine ($3^2$) combinations of two phase states, one is unused, in this situation the combination (−π/2, −π/2), which is shown by the XXX across from this combination.

Another mode of encoding that is not depicted provides converting subsets of 11 bits by means of 7 ternary phase-shift pulses This encoding method improves the robustness of the transmission, and thereby enables emission over greater distances, by increasing the angular distance separating the phase states from one another. However, a configuration in which the difference between the three phase states π/6, 5π/6 and −π/2 is greater than π/2 suffices. The configuration whose states are spaced about 2π/3 apart is, however, beneficial, because none of the phase states is given priority at the expense of the others.

Figure 5:
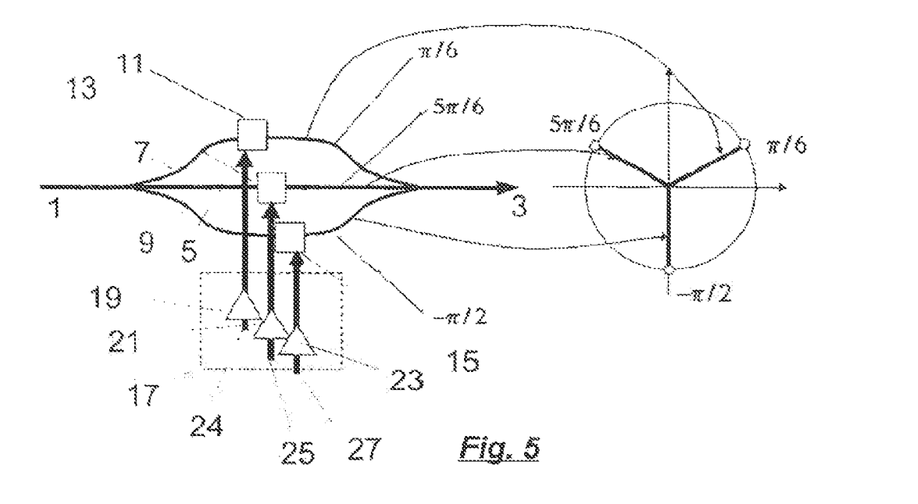
FIG. 5 is a synoptic diagram of a first embodiment of a ternary phase-modulation conversion device, as well the corresponding constellation diagram.

FIG. 5 shows a device associated with a first embodiment of the method, in particular the step of converting the binary signal subsets into pulses corresponding to a ternary optical signal.

This device receives a primary optical signal 1, emitted, for example, by a laser source, and emits a phase-modulated optical signal 3. It comprises three different optical paths 5, 7, 9 exiting the optical path of the primary signal's 1 optical path, and meeting together to form the modulated signal's optical path. By differences in optical paths, they determine one phase state from among three, π/6, 5π/6, and −π/2. On optical paths 5, 7, 9 an optical switch 11, 13, 15 is disposed, such as an electro-absorption modulator switch (EAM). These switches 11, 13, 15 are connected to a controller 17 by control channels 19, 21, 23 of said controller 17, and the controller 17 receives the signal to be modulated through its inputs 24, 25, 27.

The pulse conversion is therefore carried out in accordance with the steps that follow.

First of all, the primary optical signal 1 is separated into three secondary beams 5, 7, 9 of the same amplitude.

Next, these three intermediary beams 5, 7, 9 are brought into one phase state from among three, π/6, 5π/6, and −π/2, separated by an angle of about 2π/3 from one another.

Finally, one of the three intermediary beams 5, 7, 9 is selected by means of the switches 11, 13, 15 in order to produce a pulse coding the value of the digital signal's subsets, emitted in the form of a modulated optical signal 3.

Figure 6:
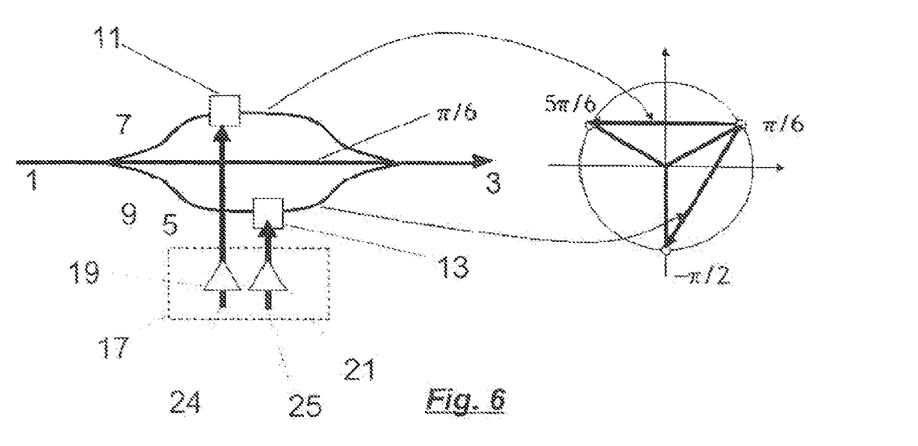
FIG. 6 is a synoptic diagram of a second embodiment of a ternary phase-modulation conversion device, as well the corresponding constellation diagram.

FIG. 6 shows a device associated with a second embodiment of the method, in particular the step of converting subsets into optical pulses.

This device receives a primary optical signal 1, and emits a phase-modulated optical signal 3. It comprises three different optical paths 5, 7, 9 exiting the optical path of the primary signal's 1 optical path, and meeting together to form the modulated signal's 3 optical path. By differences in optical path, they determine one phase state from among three, respectively π/6, π, and −2π/3. On two 7, 9 of the three optical paths 5, 7, 9, an optical switch 11, 13 is disposed. These switches are connected to a controller 17 by control channels 19, 21 of said controller 17, and the controller 17 receives the signal to be modulated through its inputs 24, 25.

The pulse conversion is therefore carried out in accordance with the steps that follow.

First of all, the primary optical signal 1 is separated into three intermediary beams 5, 7, 9, comprising an intermediary baseline beam 5 and two secondary intermediary beams 7, 9, whose amplitude is about √3 times greater than the baseline beam 5

Next, these three secondary intermediary beams 5, 7, 9 are phase-shifted by about +5π/6 and −5π/6 respectively from the secondary baseline beam 5.

Finally, one or none of the secondary intermediary beams 7 or 9 is selected by means of switches 11, 13 in order to be combined with the baseline beam 5 and create an optical pulse coding the value of the digital signal's subsets according to three possible states π/6, 5π/6 and −π/2.

Figure 7:
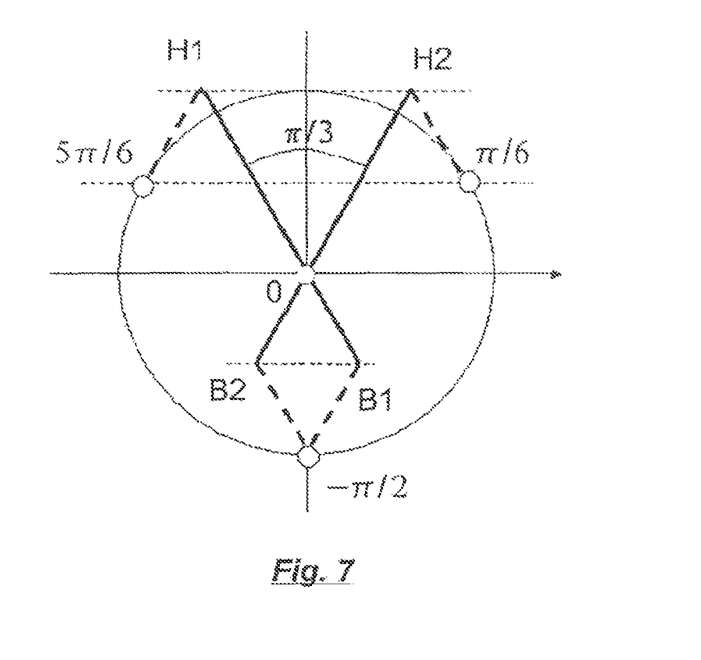
FIG. 7 is a constellation diagram illustrating one embodiment of a three-phase-state signal based on two combined BPSK signals.
Figure 8:
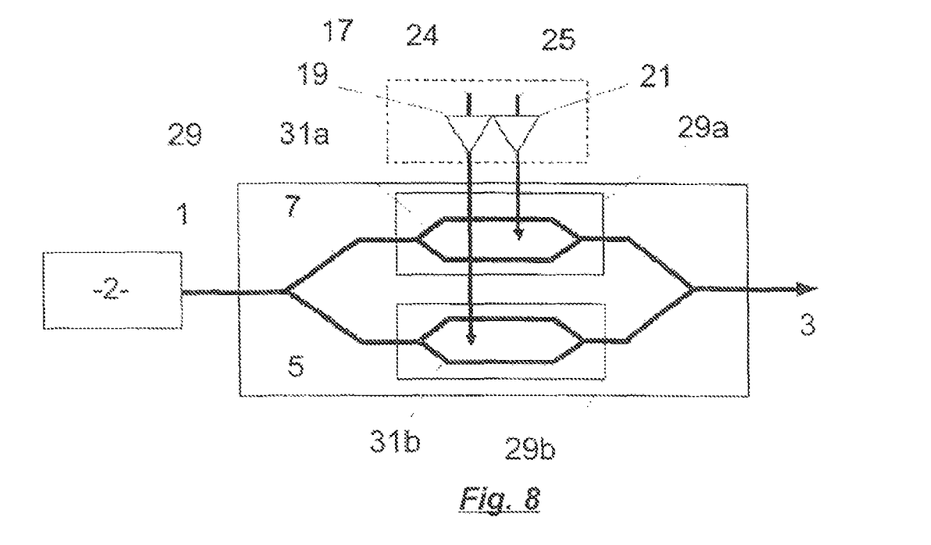
FIG. 8 is a synoptic diagram of a device for obtaining the BPSK signals of FIG. 7.
Figure 9:
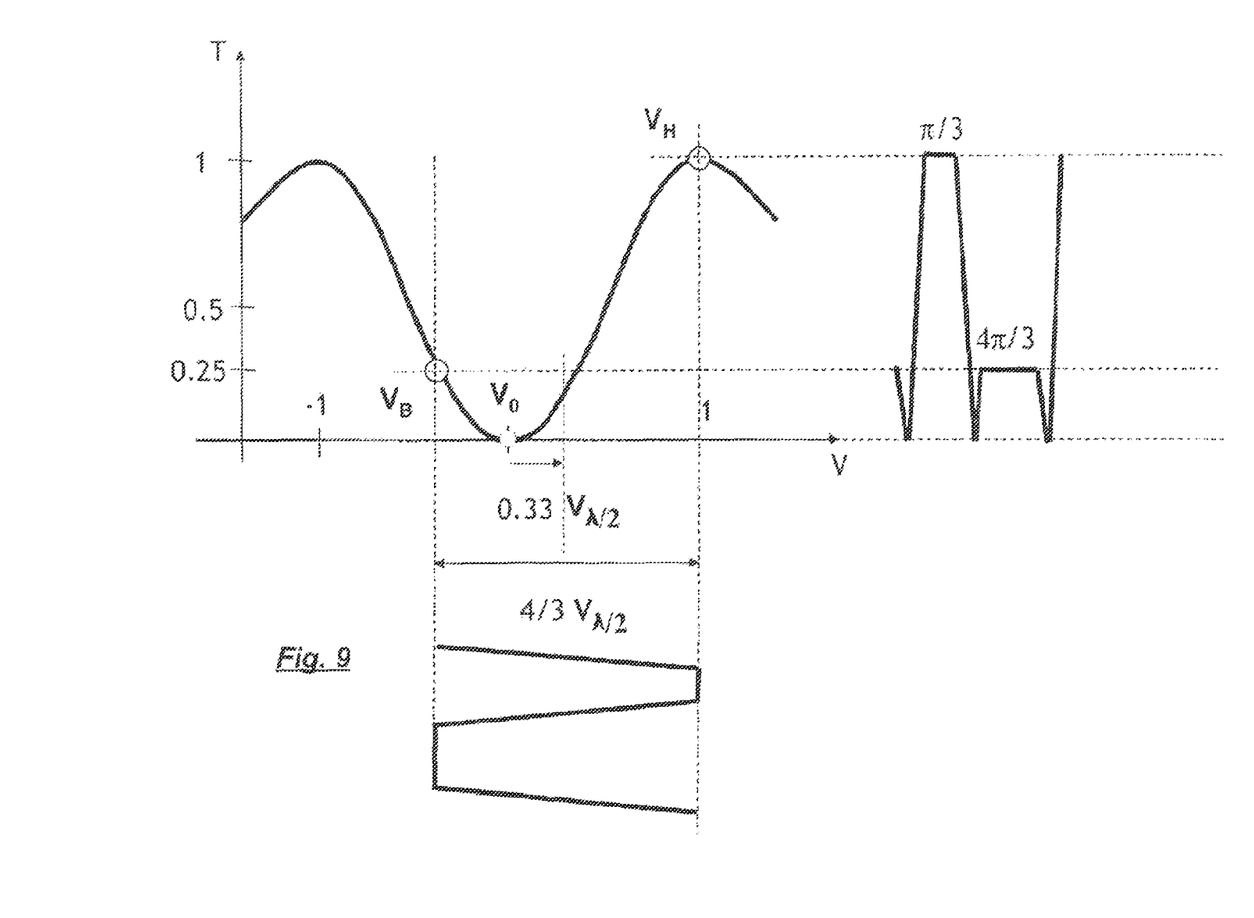
FIG. 9 is a graph of the power transmitted by an Mach-Zehnder interferometer modulator as a function of the supply voltage it receives, with the points corresponding to the settings for obtaining a constellation according to the diagram of FIG. 7.

FIGS. 7 to 9 show a third embodiment of the method, in particular the step of converting subsets into pulses. In this step, two intermediary beams 5, 7 with two phase states, as used in binary phase-shift keying, surf to obtain three-phase-state optical pulses.

FIG. 7 is a constellation diagram in which are placed the two segments [H1,B1], [H2,B2] corresponding to the two phase states of the first and second intermediary beam, and the way in which they combine in order to obtain the three phase states π/6, 5π/6, −π/2 separated by an angular distance of about 2π/3.

The two intermediary beams 5, 7 are separated by about π/3. The transmission zero point 0, corresponding to the origin of the constellation diagram, is placed at one-third of the maximum amplitude value. The segments [H1,B1],[H2,B2] representing the constellations of the intermediary beams in FIG. 7, therefore cross at one-third of their total length.

For the two intermediary beams 5, 7, one may thereby define a high state, the extreme positive H1, H2, and a low state, the extreme negative B1, B2. By combining the two beams at two possible states, four possibilities are obtained: high-high H1-H2, high-low H1-B2, low-high B1-H2 and low-low B1-B2.

If the first beam is in the high state, and the second beam is in the low state, the combination of the two states, H1-B2, is a beam separated by −π/6 from the first beam, with a relative amplitude of about √3/2 or about 0.866 times the amplitude in H1 or H2.

If the first beam is in the low state, and the second in the high state, the combination of the two states, B1-H2, is a beam separated by about 5π/6 from the first intermediary beam, with a relative amplitude of √3/2 times the amplitude in H1 or H2.

If the first and the second beam are in the low state, the combination of the two states, B1-B2, is a beam separated by about −5π/6 from the first intermediary beam, with a relative amplitude of √3/2 times the amplitude in H1 or H2.

These three combinations make it possible to obtain three phase states forming angles of about 2π/3 between them and of the same amplitude. The combination of the two intermediary beams in the high state, H1-H2, is not used.

In order to carry out the conversion as previously described, a device such as the one shown in FIG. 8 may be used.

Such a device is known as a nested modulator (or I/Q modulator, or QPSK modulator) 29, because it comprises first 29a and second 29b binary modulators within a single nested modulator 29.

This device receives a primary optical signal 1, emitted by a laser source 2, and emits a phase-modulated optical signal 3. It comprises two different optical paths 5, 7, exiting the optical path of the primary signal's 1 optical path, and meeting together to form the modulated signal's 3 optical path. By differences in optical path, they determine phase state from among π/3 or 2π/3, separated by about π/3. On optical paths 5, 7 a Mach-Zehnder interferometer 31a, 31b is disposed. These interferometers 31a, 31b are connected to a controller 17 by control channels 19, 21 of said controller 17, and the controller 17 receives the signal to be modulated through its inputs 24, 25.

At the input of said nested modulator 29, an optical signal 1 emitted by a laser source 2 therefore arise, and it generates the modulated signal 3 as an output.

The optical beam is divided into two intermediary beams 5, 7, which are directed towards two distinct optical path, having a specific optical path in which they are separated by about π/3. The intermediary beams 5, 7 are then directed towards an interferometer 31a, 31b connected to a controller 17. These interferometers 31a, 31b form of binary modulators analogous to the ones normally used for encoding by binary phase shifts, and create, depending on the pulse signal, a determined phase state 0, π.

The controller receives the converted signal of a frequency of $37.3 \cdot 10^9$ bits encoded per second, which corresponds to the conventional 112 Gigabit/s of a high-speed digital signal.

The difference in the optical paths of the interferometers 31a, 31b is proportional to a power supply voltage. The half-wave voltage $V_{\lambda/2}$ of such an interferometer is the difference in voltage between a power supply voltage corresponding to a minimum transmitted power and the power supply voltage at the closest maximum transmitted power.

If the power supply voltage of the value corresponding to the half-wave voltage $V_{\lambda/2}$ is increased or decreased, the difference in optical path changes by a half-wavelength λ/2, and it switches from a maximum transmitted power to a minimum transmitted power.

In order to create the two rectilinear constellations as depicted in FIG. 7, the Mach-Zehnder interferometers 31a, 31b of the divisive FIG. 8 are configured as depicted in FIG. 9.

FIG. 9 is a diagram representing the power transmitted by an interferometer 31a or 31b set to 1, on the y-axis, and as a function of the power supply voltage, on the x-axis.

In particular, it is seen that whenever the power supply voltage increases, the transmitted power oscillates. It successively reaches maximums and minimums. Between a maximum and the following minimum, the supply voltage changes by a value corresponding to the half-wave voltage $V_{\lambda_2}$.

The zero operating point of the interferometers, corresponding to the transmission zero, is located at $0.33V_{\lambda_{/2}}$ of a minimum transmitted power. The first $V_H$ and the second $V_B$ working voltage of the interferometers, respectively corresponding to the high states H1, H2 and low states B1, B2 of the constellation diagram of FIG. 7, are respectively located about $+0.66V_{\lambda_{/2}}$ and $-0.66V_{\lambda_{/2}}$ from zero operating point, bounding off a voltage range of about $1.33V_{\lambda_{/2}}$. The first working voltage $V_H$ is thereby located close to the maximum transmitted power, while the second $V_B$ is about halfway between the previous maximum and the minimum contained within the range.

The first working voltage $V_H$ thereby corresponds to a standardized transmitted power of 1, and the second $V_B$ to a standardized transmitted power of 0.5, interpreted as −0.5, negative (the intensity is equal to 0.25, but the signal's amplitude is −0.5, i.e. 0.5 with a phase of about π). It is this adjustment of the interferometers that enables the placement of the transmission zero 0 one-third of the distance between the high states H1, H2 and low states B1, B2 on the constellation diagram, and therefore obtaining the three-phase states π/6, 5π/6, −π/2 spaced at an angular distance of about 2π/3 apart for creating optical pulses.

Figure 10:
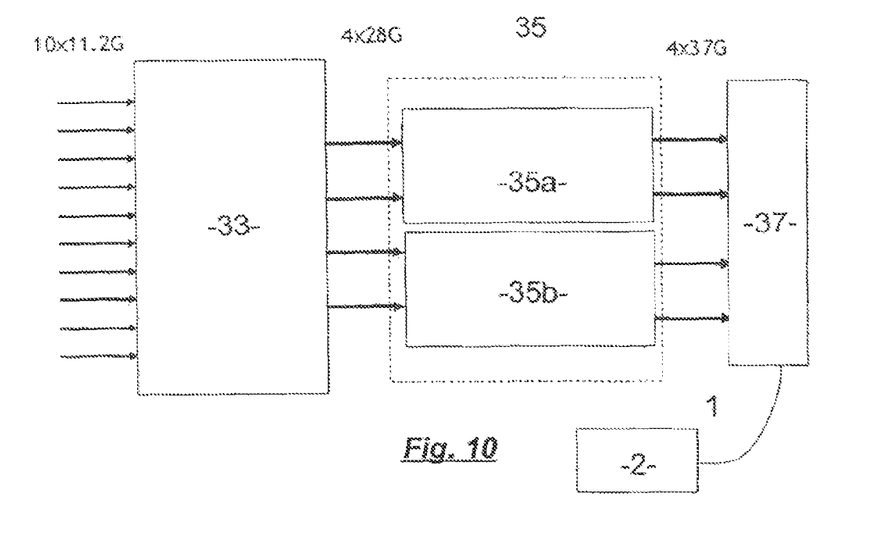
FIG. 10 is a synoptic diagram of a device for enabling the switchover from a quaternary phase modulation conversion to a ternary phase modulation conversion using the method described above.

FIG. 10 depicts how a device to transcribe from quaternary coding to the ternary coding may be carried out and implemented within networks in order to enable a conversion of a digital signal into modulated optical pulses in accordance with the method described above, without adapting the elements of the upstream network.

First, a multiplexer 33 receives the incoming signals from ten channels that 11.2 Gigabit/s, and emits four intermediary signal that 28 Gigabit/s, over channels leading to a transcription device 35.

The transcription device 35 comprising two subdevices 35a, 35b to transcribe from quaternary coding to ternary coding, one for each binary modulator 31a, 31b of a nested modulator 19. The transcription device 35 emits four signals at 37.3 Gigabits/s using the conversion table described above (or another, more optimal one), send to a device to convert a digital signal into ternary coding pulses.

These 37.3 Gigabit/s signals are then sent to a conversion device as described above.

During operation, the multiplexer 33 transforms the ten 11.2 Gigabit/s digital signals into four 28 Gigabit/s intermediary signals, intended to enable the transmission of quaternary phase-shift keying optical pulses, for example by means of two binary modulators 31a, 31b.

The intermediary signals are received by the transcription device 35 that conference the intermediary signals into coded signals for a ternary phase-shift keying conversion, for example by using the table in FIG. 4, and sends them to a conversion device 37 as previously described, where optical pulses are generated corresponding to said signal based on a primary optical signal 1, emitted, for example, by a laser source 2.

Figure 11:
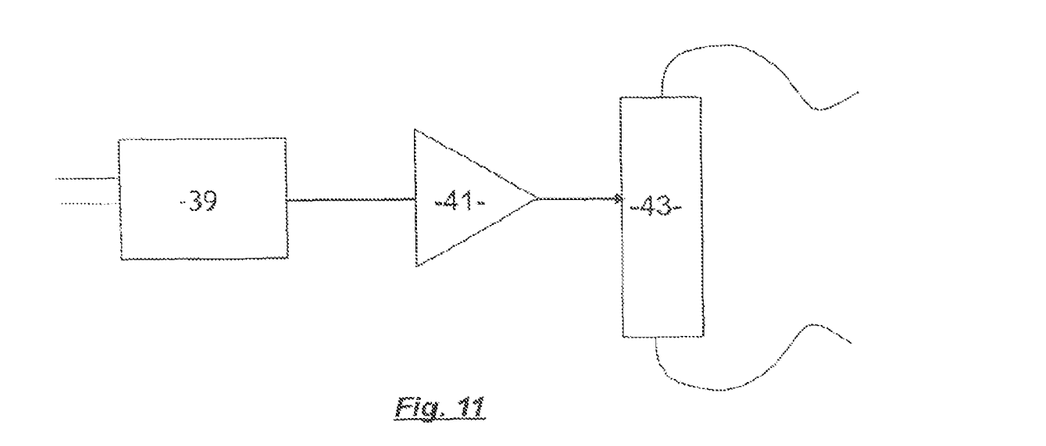
FIG. 11 is a synoptic diagram of a device for enabling the switchover from a quaternary phase modulation conversion to a ternary phase modulation conversion using a digital-analog converter.

FIG. 11 depicts an alternative assembly embodiment enabling the conversion of the digital signal into quaternary phase-shift light pulses The digital signal is received by a digital-analog converter 39, which converts the digital signal into a three-state signal, for example by using an encoding analogous to the one of the conversion table in FIG. 4, then sent to a controller 41. The controller 41 controls a phase modulator 43 with three possible states π/6, 5π/6 ct −π/2, which emits an encode phase-shift modulated light signal, corresponding to the incoming digital signal.

Figure 12:
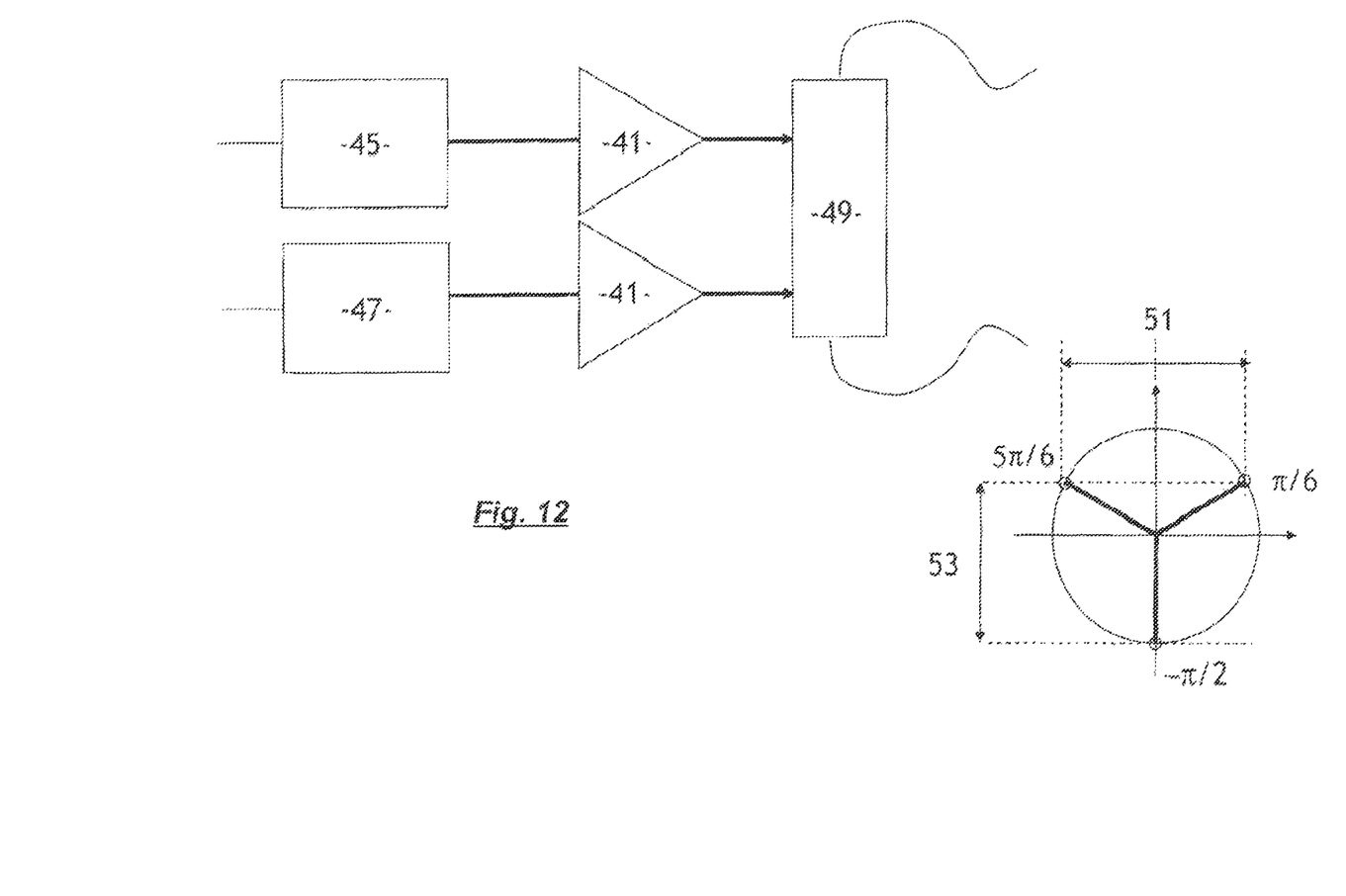
FIG. 12 is a synoptic diagram enabling the switchover from a quaternary phase modulation conversion to a ternary phase modulation conversion using two digital-analog converters and a conventional quadratic modulator, In all the figures, the same elements bear the same references.

FIG. 12 is an alternative assembly embodiment enabling the conversion of the digital signal into ternary phase-shift light pulses using two digital-analog converters 45, 47 and a conventional quaternary phase-shifted phase modulator 49.

The digital signal is received by two digital-analog converters 45, 47, one of which 45 has three operating states, and the other 47, two. The converters 45, 47 are connected to a controller 41, and these controllers control a quaternary phase-shift phase modulator 49, for example one described previously, with two phase-shifted arms, in order to locate the ternary phase states within the phase plane.

The controllers 41 particularly control one of the two arms of the modulator 49, and the two arms are separated from one another by about π/2. The three states $\sqrt{3}/2$, 0 and $-\sqrt{3}/2$ of the first controller 41 are represented by the double arrow 51, and the two states ½, −1 of the second controller 41 by the double arrow 53. By wisely combining the states of the two controllers 41, the various phase states of the ternary keying are obtained: π/6 ($\sqrt{3}/2$; ½), 5π/6 ($-\sqrt{3}/2$; ½ and −π/2 (0, −1).

The invention therefore makes it possible to obtain a conversion method enabling conventional high-speed transmission of digital signals in a robust fashion. This method also does not require any major changes to already-existing networks, except for the change in the configuration of the conversion devices that are already in use.

The invention claimed is:

1. A method for converting a digital signal into optical pulses, comprising the steps:
    separating an optical signal into three intermediary beams,
    phase-shifting the three intermediary beams by an angle of about 2π/3 from one another, and
    selecting at least one of the intermediary beams for creating optical pulses coding the digital signal.

2. The method according to claim 1, wherein the digital signal is distributed into subsets comprising three bits, and in which the optical pulses serve to code the subsets.

3. The method of claim 2, wherein the step of separating an optical signal comprises
    separating an optical signal into three intermediary beams comprising an intermediary baseline beam and two secondary intermediary beams whose amplitude is $\sqrt{3}$ greater than the intermediary baseline beam;
    wherein the step of phase-shifting comprises phase-shifting the secondary intermediary beams by about +5π/6 and −5π/6 in relation to the intermediary baseline beam, rather than phase-shifting the three intermediary beams by an angle of about π2/3 from one another; and
    further comprising the step of selecting and combining one or none of the secondary intermediary beams with the intermediary baseline beam in order to create optical pulses coding the subsets.

4. A method for converting a digital signal into optical pulses, comprising the steps of:
separating an optical signal into two intermediary beams, phase-shifting the intermediary beams by about $\pi/3$ from one another,
positioning an emission zero point at about ⅓ of the maximum amplitude in order to define for intermediary beams a high state (H1, H2) and a low state (B1, B2), and
combining the intermediary beams in their high states (H1, H2) or low states (B1, B2) in order to create the optical pulses coding the digital signal.

5. The method according to claim 4, wherein the intermediary beams are directed towards Mach-Zehnder having their zero operating point ($V_O$) at about 0.33 times the half-wave voltage ($V_{\lambda/2}$) of a minimum transmitted power, and high ($V_H$) and low ($V_B$) operating voltages, respectively associated with high (H1, H2) and low (B1, B2) states, respectively located at about +0.66 times the half-wave voltage ($V_{\lambda/2}$) and −0.66 times the half-wave voltage ($V_{\lambda/2}$) of the operating zero point ($V_O$).

6. A device for converting a high-speed digital signal in the form of optical pulses, comprising:
means of separating an optical signal into three intermediary beams with different optical paths, leading to a phase shift between the three intermediary beams by about $2\pi/3$ from one another;
a controller; and
switches controlled by the controller which can interrupt the intermediary beams.

7. A device according to claim 6, wherein said device transcribes coded signals intended for quaternary modulation conversion into coded signals intended for ternary modulation conversion, linked to the controller.

8. A device according to claim 6, wherein the switches comprise electro-absorption modulator switches (EAM).

9. A device that converts a digital signal into optical pulses, comprising:
means for converting a optical signal into an intermediary baseline beam and two secondary intermediary beams whose amplitude is $\sqrt{3}$ greater than the intermediary baseline beam and different optical paths for intermediary beams causing a phase shift of the two secondary intermediary beams of about +5π/6 and −5π/6 respectively from the baseline beam;
a controller; and
switches controlled by the controller which can selectively interrupt one of the secondary intermediary beams.

10. A device according to claim 9, wherein said device transcribes coded signals intended for quaternary modulation conversion into coded signals intended for ternary modulation conversion, linked to the controller.

11. A device according to claim 9, wherein the switches comprise electro-absorption modulator switches (EAM).

12. A device that converts a digital signal into optical pulses, comprising:
means of separating an optical signal into two intermediary beams, and different optical path for the intermediary beams leading to a phase shift of about $\pi/3$ between them;
Mach-Zehnder interferometers having their zero operating point ($V_O$) at about 0.25 times the half-wave voltage ($V_{\lambda/2}$) by a minimum transmitted power, and high ($V_H$) and low ($V_B$) operating voltages respectively located at about +0.75 times the half-wave voltage ($V_{\lambda/2}$) and −0.75 times the half-wave voltage ($V_{\lambda/2}$) of the zero operating point ($V_O$) placed on the optical paths of the intermediary beams; and
a controller controlling the Mach-Zehnder interferometers.

13. A device according to claim 12, wherein device transcribes coded signals intended for quaternary modulation conversion into coded signals intended for ternary modulation conversion, linked to the controller.

14. A device that converts high speed a digital signal into optical pulses, comprising:
a digital-analog converter intended to convert the high-speed digital signal into a three-state analog signal; and
a three-phase-state ($\pi/6$, $5\pi/6$, $-\pi/2$) phase modulator linked to the digital-analog converter and controlled by said three-state analog signal emitted by said digital-analog converter, from whose output the optical pulses are emitted.

15. A device that converts a high speed digital signal into optical pulses, comprising:
two digital-analog converters, intended to convert the high-speed digital signal into two analog signal with three states ($\sqrt{3}/2$, 0, $-\sqrt{3}/2$), the other with two states (½, −1); and
a quaternary phase modulator comprising two arms, corresponding to two optical paths phase-shifted from one another by about $\pi/2$, and controlled by one of the analog signals, from whose output the optical pulses are emitted.

* * * * *